(12) United States Patent
Shimizu

(10) Patent No.: US 6,218,712 B1
(45) Date of Patent: Apr. 17, 2001

(54) SEMICONDUCTOR DEVICE AND METHOD OF MANUFACTURING SAME

(75) Inventor: Kazuhiro Shimizu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/325,043

(22) Filed: Jun. 3, 1999

(30) Foreign Application Priority Data

Dec. 25, 1998 (JP) .................................................. 10-369408

(51) Int. Cl.[7] .................................................. H01L 29/76
(52) U.S. Cl. .......................... 257/384; 257/382; 257/383; 257/384; 257/387; 257/388
(58) Field of Search ................... 257/382, 383, 257/384, 387, 388

(56) References Cited

U.S. PATENT DOCUMENTS

| 5,736,461 | * | 4/1998 | Berti et al. ............................. | 438/651 |
|---|---|---|---|---|
| 5,739,573 | * | 4/1998 | Kawaguchi ............................ | 257/384 |
| 5,874,342 | * | 2/1999 | Tsai et al. .............................. | 438/301 |
| 5,883,418 | * | 3/1999 | Kimura ................................. | 257/412 |
| 5,942,767 | * | 8/1999 | Na et al. ................................ | 257/59 |
| 5,982,001 | * | 11/1999 | Wu ........................................ | 257/344 |
| 6,040,593 | * | 3/2000 | Park ..................................... | 257/292 |
| 6,043,537 | * | 3/2000 | Jun et al. ............................... | 257/350 |

FOREIGN PATENT DOCUMENTS

| 362238667 | * | 10/1987 | (JP) ..................................... | 257/384 |
|---|---|---|---|---|
| 402096375 | * | 4/1990 | (JP) ..................................... | 257/384 |
| 402278728 | * | 4/1990 | (JP) ..................................... | 257/384 |

OTHER PUBLICATIONS

T. Laska, et al. "1200V–Trench–IGBT Study with Square Short Circuit SOA", Proceedings of 1998 International Symposium on Power Semiconductor Devices & ICs, Kyoto, pp. 433–436.

B. J. Baliga, "Power Semiconductor Devices", PWS Publishing Company, pp. 398–402 (7.7.1 Bipolar Second Breakdown and 7.7.2 MOS Second Breakdown).

* cited by examiner

Primary Examiner—Eddie C. Lee
Assistant Examiner—Edgardo Ortiz
(74) Attorney, Agent, or Firm—Oblon, Spivak, McClelland, Maier & Neustadt, P.C.

(57) ABSTRACT

A semiconductor device includes a pair of second semiconductor regions (5) selectively formed in predetermined spaced apart relation in a first semiconductor region (3), and a silicide film (8) formed in an upper main surface of the first semiconductor region (3) between the pair of second semiconductor regions (5). The silicide film (8) is formed to establish an electric connection between side surfaces of the second semiconductor regions (5) at their respective edges opposed to each other. A source electrode (11) is formed on an upper surface of the silicide film (8). The semiconductor device has an increased safe operating area without the increase in manufacturing costs. A method of manufacturing the semiconductor device is also provided.

8 Claims, 12 Drawing Sheets

US 6,218,712 B1

SEMICONDUCTOR DEVICE AND METHOD OF MANUFACTURING SAME

BACKGROUND OF THE INVENTION

1. Field of the Invention

The present invention relates to a semiconductor device and a method of manufacturing the same. More particularly, the invention relates to a semiconductor device having an effective channel length specified by the difference in diffusion length between two impurities of different conductivity types, and a method of manufacturing the same.

2. Description of the Background Art

MOSFETs formed by the DSA (Diffusion Self-Align) process are referred to as DMOS transistors. A DMOS transistor is one of the semiconductor devices having an effective channel length specified by the difference in diffusion length between two impurities of different conductivity types.

FIG. 16 shows a cross-sectional structure of a background art DMOS transistor 80. As shown in FIG. 16, the DMOS transistor 80 comprises a semiconductor body BD including a semiconductor substrate 1 containing an n-type impurity of a relatively high concentration ($n^+$), and an epitaxial layer 2 formed on the semiconductor substrate 1 and containing an n-type impurity of a relatively low concentration ($n^-$).

A first semiconductor region 3 containing a p-type impurity and a pair of second semiconductor regions 5 containing an n-type impurity of a relatively high concentration are double diffused in an upper main surface of the epitaxial layer 2. The pair of second semiconductor regions 5 are selectively formed in predetermined spaced apart relationship in the first semiconductor region 3. A source electrode 11 is formed on respective edges (referred to as first edges) of the pair of second semiconductor regions 5 which are opposed to each other and on an upper surface of part of the first semiconductor region 3 which lies between the pair of second semiconductor regions 5.

A deep semiconductor region 4 containing a p-type impurity of a relatively high concentration ($p^+$) is formed in partially overlapping relationship with the first semiconductor region 3 and extends to a deeper position than the first semiconductor region 3.

A pair of gate insulation films 6 are formed on the first semiconductor region 3 outside of respective edges (referred to as second edges) of the pair of second semiconductor regions 5 which are on the opposite sides from the first edges and on the upper main surface of the epitaxial layer 2. A pair of gates 7 are formed on the gate insulation films 6, respectively. Part of the first semiconductor region 3 which lies immediately under each of the gates 7 serves as a channel region when the device is in operation.

Isolating insulation films 10 are formed to cover the upper and side surfaces of the gates 7 and the upper surface of the second semiconductor regions 5. The isolating insulation films 10 are provided for electric isolation between the gates 7 and the source electrode 11.

A drain electrode 12 is formed on the opposite main surface of the semiconductor substrate 1 from the epitaxial layer 2.

In FIG. 16, electric connections between the gates 7, the source electrode 11 and the drain electrode 12 are shown in diagrammatic form, and respective terminals thereof are designated by the reference characters G, S and D.

In the DMOS transistor 80 with such an arrangement, the length of the second semiconductor regions 5 as measured in the direction of a main current flow is specified by an isolation margin between each of the gates 7 and the source electrode 11 and the length of a contact between the source electrode 11 and each of the second semiconductor regions 5. This will be described with reference to a partial view of the DMOS transistor 80 shown in FIG. 17.

The length a of the second semiconductor region 5 as shown in FIG. 17 is substantially determined by the sum of the isolation margin b between the gate 7 and the source electrode 11 and the contact length c between the source electrode 11 and the second semiconductor region 5.

The isolation margin b is set at a length determined in consideration for mask alignment precision and the like during manufacture to prevent a fault resulting from a short circuit between the gate 7 and the source electrode 11. The contact length c is set so that a predetermined contact resistance is provided between the source electrode 11 and the second semiconductor region 5. Both of the isolation margin b and the contact length c are not permitted to be extremely short.

FIG. 18 shows an equivalent circuit of the DMOS transistor 80. As shown in FIG. 18, the DMOS transistor 80 comprises the epitaxial layer 2, the first semiconductor region 3, the second semiconductor region 5, and the gate 7. The DMOS transistor 80 further has a parasitic NPN transistor T1 comprised of the epitaxial layer 2, the first semiconductor region 3 and the second semiconductor region 5, and a resistance element R1 depending on the length of the second semiconductor region 5 (as measured in the direction of the main current flow) and present in the first semiconductor region 3 under the second semiconductor region 5 which serves as a hole current path.

A hole current flow into the resistance element R1 develops a potential equivalent to the product of the hole current and the resistance element R1. FIG. 19 schematically shows a flow of hole current HL and a flow of electron current EL.

When the increasing hole current causes the potential resulting from the resistance element R1 to exceed a built-in potential (about 0.7 V) of a pn junction, the parasitic NPN transistor T1 turns ON to cause a very large current to flow into the DMOS transistor 80, resulting in breakdown of the DMOS transistor 80. To prevent such a situation, it is necessary to limit a drain current to prevent the increase in hole current. This results in the decrease in current area (safe operating area) in which the DMOS transistor 80 operates safely.

An example of the background art DMOS transistors includes a DMOS transistor 90 having a cross-sectional structure shown in FIG. 20. The DMOS transistor 90 shown in FIG. 20 is constructed such that a source electrode 11 contacts side surfaces of a pair of second semiconductor regions 5 at their respective edges (referred to as first edges) opposed to each other, and the side and bottom surfaces of a recessed portion RC formed in the first semiconductor region 3 between the pair of second semiconductor regions 5. Like reference numerals and characters are used to designate constituents identical with those of the DMOS transistor 80 shown in FIG. 16, and the description thereon will be dispensed with.

The DMOS transistor 90 in which the source electrode 11 contacts the side surfaces of the second semiconductor regions 5 is not required to bring the source electrode 11 into contact with the main surface of the second semiconductor regions 5. Thus, the length of the second semiconductor regions 5 (as measured in the direction of the main current flow) is specified only by the isolation margin between each of the gates 7 and the source electrode 11. Therefore, the length of the second semiconductor regions 5 of the DMOS transistor 90 is less than that of the DMOS transistor 80 shown in FIG. 16. Further, the decrease in the isolation margin may further shorten the length of the second semiconductor regions 5 to decrease the resistance element under each of the second semiconductor regions 5 to increase the safe operating current area. FIG. 21 schematically shows flows of hole current HL and electron current El, and a resistance element R2 under the second semiconductor region 5 in the DMOS transistor 90.

However, the decrease in the isolation margin increases the rate of faults resulting from a short circuit between the gate 7 and the source electrode 11, and involves the need for a high-precision mask alignment process step to deal with the decreased isolation margin. The use of manufacturing equipment to solve the above-mentioned problems adds to manufacturing costs.

SUMMARY OF THE INVENTION

According to a first aspect of the present invention, a semiconductor device comprises: a first semiconductor layer of a first conductivity type; a first semiconductor region of a second conductivity type selectively formed in a first main surface of the first semiconductor layer; a second semiconductor region of the first conductivity type selectively formed in a surface of the first semiconductor region; a silicide film selectively formed in the surface of the first semiconductor region and in contact with a side surface of the second semiconductor region at its first edge; a gate insulation film formed on the first semiconductor region outside of a side surface of the second semiconductor region at its second edge opposite from the first edge; a gate formed on the gate insulation film; and a sidewall insulation film covering a side surface of the gate, a side surface of the gate insulation film, and an upper surface of the second semiconductor region.

Preferably, according to a second aspect of the present invention, the semiconductor device of the first aspect further comprises: an isolating insulation film formed to cover the gate and the sidewall insulation film and to partially cover the silicide film; a first main electrode layer electrically connected to part of the silicide film which is not covered with the isolating insulation film; a second semiconductor layer of the first conductivity type formed on a second main surface of the first semiconductor layer; and a second main electrode layer formed on a main surface of the second semiconductor layer.

Preferably, according to a third aspect of the present invention, the semiconductor device of the first aspect further comprises: an isolating insulation film formed to cover the gate and the sidewall insulation film and to partially cover the silicide film; a first main electrode layer electrically connected to part of the silicide film which is not covered with the isolating insulation film; a second semiconductor layer of the first conductivity type formed on a second main surface of the first semiconductor layer; a third semiconductor layer of the second conductivity type formed on a main surface of the second semiconductor layer, and a second main electrode layer formed on a main surface of the third semiconductor layer.

Preferably, according to a fourth aspect of the present invention, the semiconductor device of the first aspect further comprises: an isolating insulation film formed to cover the gate and the sidewall insulation film and to partially cover the silicide film; a first main electrode layer electrically connected to part of the silicide film which is not covered with the isolating insulation film; an under-main-electrode silicide film selectively formed in the first main surface of the first semiconductor layer and in spaced apart relationship with the first semiconductor region; and a second main electrode layer formed on the under-main-electrode silicide film.

Preferably, according to a fifth aspect of the present invention, in the semiconductor device of any one of the first to fourth aspects, the silicide film is deeper than the second semiconductor region.

A sixth aspect of the present invention is also intended for a method of manufacturing a semiconductor device. According to the present invention, the method comprises the steps of: (a) forming a gate insulation film and a gate in stacked relationship in the order named on a first main surface of a first semiconductor layer of a first conductivity type; (b) forming a predetermined opening in the gate by patterning the gate, and then selectively introducing and diffusing an impurity of a second conductivity type through the opening into the first main surface of the first semiconductor layer to form a first semiconductor region; (c) selectively introducing an impurity of the first conductivity type into an upper surface of the first semiconductor region; (d) forming an insulation film covering the gate and the first semiconductor region; (e) removing the insulation film by anisotropic etching to form a sidewall insulation film covering a side surface of the gate, a side surface of the gate insulation film and part of the upper surface of the first semiconductor region; (f) forming a metal film on top of an entire upper surface of a resultant structure; and (g) performing heat treatment to silicide at least part of the metal film which overlies the first semiconductor region and is not covered with the sidewall insulation film, thereby forming a silicide film in the upper surface of the first semiconductor region, and also to diffuse the impurity of the first conductivity type contained in part of the first semiconductor region which is covered with the sidewall insulation film, thereby forming a second semiconductor region under the sidewall insulation film in a self-aligned manner.

A seventh aspect of the present invention is also intended for a method of manufacturing a semiconductor device. According to the present invention, the method comprises the steps of: (a) forming a gate insulation film and a gate in stacked relationship in the order named on a first main surface of a first semiconductor layer of a first conductivity type; (b) forming a predetermined opening in the gate by patterning the gate, and then selectively introducing and diffusing an impurity of a second conductivity type through the opening into the first main surface of the first semiconductor layer to form a first semiconductor region; (c) selectively introducing an impurity of the first conductivity type into an upper surface of the first semiconductor region to form a second semiconductor region; (d) forming an insulation film covering the gate and the second semiconductor region; (e) removing the insulation film by anisotropic etching to form a sidewall insulation film covering a side surface of the gate, a side surface of the gate insulation film and part of an upper surface of the second semiconductor region; (f) forming a metal film for silicide film formation on top of an entire upper surface of a resultant structure; and (g) performing heat treatment to silicide at least part of the metal film which overlies the second semiconductor region and is not covered with the sidewall insulation film, thereby modifying the part into a silicide film, and also to leave the second semiconductor region under the sidewall insulation film in a self-aligned manner.

Preferably, according to an eighth aspect of the present invention, in the method of the sixth or seventh aspect, the step (f) comprises the step of forming the metal film having a thickness of at least 1000 Å, and the step (g) comprises the step of annealing at a temperature ranging from 600° C. to 880° C. for the heat treatment.

Preferably, according to a ninth aspect of the present invention, in the method of the eighth aspect, the step (f) comprises the step of forming the metal film composed of a material selected from the group consisting of platinum, titanium, aluminum and tungsten.

In the semiconductor device according to the first aspect of the present invention, the second semiconductor region is formed immediately under the sidewall insulation film, and the length of the second semiconductor region as measured in the direction of a main current flow is approximately equal to the width of the sidewall insulation film. This allows an extremely low resistance element in the first semiconductor region under the second semiconductor region. This makes the electric potential resulting from the resistance element difficult to exceed the built-in potential of a pn junction even if hole current increases, thereby preventing a parasitic transistor comprised of the first and second semiconductor regions and the first semiconductor layer from turning ON. This eliminates the need to limit a main current to increase a safe operating area.

In the semiconductor device according to the second aspect of the present invention, the second semiconductor region is formed immediately under the sidewall insulation film, and the length of the second semiconductor region as measured in the direction of the main current flow is specified by the width of the sidewall insulation film. For reduction in the above-mentioned length, it is not necessary to reduce the thickness of the isolating insulation film that specifies an isolation margin between the gate and the first main electrode layer. Therefore, a DMOS transistor is achieved which prevents the increase in the rate of faults resulting from a short circuit between the gate and the first main electrode layer.

In the semiconductor device according to the third aspect of the present invention, the second semiconductor region is formed immediately under the sidewall insulation film, and the length of the second semiconductor region as measured in the direction of the main current flow is specified by the width of the sidewall insulation film. This prevents a parasitic transistor comprised of the first and second semiconductor regions and the first semiconductor layer from turning ON and interacting with a transistor comprised of the first semiconductor region and the first, second and third semiconductor layers to perform a thyristor action. Additionally, for reduction in the above-mentioned length, it is not necessary to reduce the thickness of the isolating insulation film that specifies the isolation margin between the gate and the first main electrode layer. Therefore, an IGBT is achieved which prevents the increase in the rate of faults resulting from a short circuit between the gate and the first main electrode layer.

In the semiconductor device according to the fourth aspect of the present invention, the second semiconductor region is formed immediately under the sidewall insulation film, and the length of the second semiconductor region as measured in the direction of the main current flow is specified by the width of the sidewall insulation film. For reduction in the above-mentioned length, it is not necessary to reduce the thickness of the isolating insulation film that specifies the isolation margin between the gate and the first main electrode layer. Therefore, a lateral DMOS transistor is achieved which prevents the increase in the rate of faults resulting from a short circuit between the gate and the first main electrode layer.

In the semiconductor device according to the fifth aspect of the present invention, the silicide film is deeper than the second semiconductor region. This provides as wide a contact area with the second semiconductor region as possible to reduce contact resistance.

In the method according to the sixth aspect of the present invention, the sidewall insulation film is formed in a self-aligned manner, and the second semiconductor region is formed immediately under the sidewall insulation film also in a self-aligned manner. The formation of both of the sidewall insulation film and the second semiconductor region requires no high-precision mask alignment step and no high-precision manufacturing equipment for providing a semiconductor device wherein the length of the second semiconductor region as measured in the direction of the main current flow is reduced, thereby suppressing the increase in manufacturing costs. Additionally, at the same time that the silicide film is formed, the impurity of the first conductivity type contained in the first semiconductor region is diffused to form the second semiconductor region. This eliminates the need to perform an additional heat treatment step for the formation of the second semiconductor region only, thereby reducing the manufacturing steps.

In the method according to the seventh aspect of the present invention, the sidewall insulation film is formed in a self-aligned manner, and the second semiconductor region is formed immediately under the sidewall insulation film also in a self-aligned manner. The formation of both of the sidewall insulation film and the second semiconductor region requires no high-precision mask alignment step and no high-precision manufacturing equipment for providing a semiconductor device wherein the length of the second semiconductor region as measured in the direction of the main current flow is reduced, thereby suppressing the increase in manufacturing costs. Furthermore, the second semiconductor region is formed prior to the formation of the silicide film. Therefore, if the heat treatment conditions for the formation of the silicide film are not compatible with the conditions for the formation of the second semiconductor region, the method according to the seventh aspect of the present invention reliably provides the second semiconductor region.

The method according to the eighth aspect of the present invention can provide a semiconductor device in which the silicide film is deeper than the second semiconductor region.

The method according to the ninth aspect of the present invention can provide a practical silicide film electrically connected to the second semiconductor region.

It is therefore an object of the present invention to provide a semiconductor device having an increased safe operating area without the increase in manufacturing costs, and a method of manufacturing the same.

These and other objects, features, aspects and advantages of the present invention will become more apparent from the following detailed description of the present invention when taken in conjunction with the accompanying drawings.

DESCRIPTION OF THE PREFERRED EMBODIMENTS

<A. First Preferred Embodiment>

<A-1. Device Structure>

Figure 1:
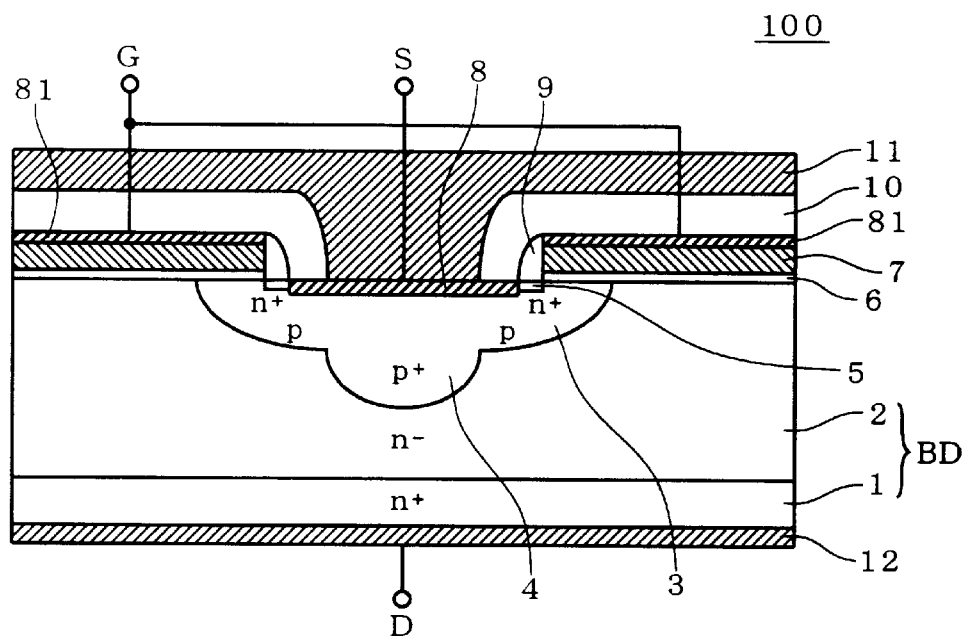
FIG. 1 is a cross-sectional view of a semiconductor device according to a first preferred embodiment of the present invention.

FIG. 1 shows a cross-sectional structure of a DMOS transistor 100 which is a semiconductor device according to a first preferred embodiment of the present invention A DMOS transistor is a MOSFET formed by the DSA (Diffusion Self-Align) process, and is one of the semiconductor devices having an effective channel length specified by the difference in diffusion length between two impurities of different conductivity types.

As illustrated in FIG. 1, the DMOS transistor 100 comprises a semiconductor body BD including a semiconductor substrate 1 (second semiconductor layer) such as a silicon substrate which contains an n-type impurity of a relatively high concentration (n+; about $1 \times 10^{18}/cm^3$), and an epitaxial layer 2 (first semiconductor layer) formed on the semiconductor substrate 1 and containing an n-type impurity of a relatively low concentration (n−; about $1 \times 10^{15}/cm^3$).

A first semiconductor region 3 containing a p-type impurity (of a surface concentration on the order of $1 \times 10^{16}/cm^3$) and a pair of second semiconductor regions 5 containing an n-type impurity of a relatively high concentration (a surface concentration on the order of $1 \times 10^{20}/cm^3$) are double diffused in an upper main surface of the epitaxial layer 2. The pair of second semiconductor regions 5 is selectively formed in predetermined spaced apart relationship in the first semiconductor region 3. A silicide film 8 is formed in an upper main surface of the first semiconductor region 3 between the pair of second semiconductor regions 5.

The silicide film 8 is formed to establish an electric connection between side surfaces of the second semiconductor regions 5 at their respective edges (referred to as first edges) opposed to each other. A source electrode 11 (first main electrode) is formed on an upper surface of the silicide film 8.

A deep semiconductor region 4 containing a p-type impurity of a relatively high concentration (p+; a surface concentration of about $1 \times 10^{18}/cm^3$) is formed in partially overlapping relationship with the first semiconductor region 3 and extends to a deeper position (at a depth of 4 to 5 μm) than the first semiconductor region 3 (having a depth of about 3 μm).

A pair of gate insulation films 6 are formed on the first semiconductor region 3 outside of respective edges (referred to as second edges) of the pair of second semiconductor regions 5 which are on the opposite sides from the first edges and on the upper main surface of the epitaxial layer 2. A pair of gates 7 are formed on the gate insulation films 6, respectively. A pair of silicide films 81 are formed on the gates 7, respectively. Part of the first semiconductor region 3 which lies immediately under each of the gates 7 serves as a channel region when the device is in operation.

A pair of sidewall insulation films 9 are formed to cover the side surfaces of the silicide films 81, the gates 7 and the gate insulation films 6 and to cover the upper surface of the second semiconductor regions 5, respectively. A pair of isolating insulation films 10 are formed to cover the upper surface of the silicide films 81, the sidewall insulation films 9, and upper surface parts of the silicide film 8. The isolating insulation films 10 are provided for electric isolation between the gates 7 and the source electrode 11.

A drain electrode 12 (second main electrode) is formed on the opposite main surface of the semiconductor substrate 1 from the epitaxial layer 2.

In FIG. 1, electric connections between the gates 7, the source electrode 11 and the drain electrode 12 are shown in diagrammatic form, and respective terminals thereof are designated by the reference characters G, S and D.

<A-2. Manufacturing Method>

Description will be given on a method of manufacturing the DMOS transistor 100 with reference to FIGS. 2 through 10 which illustrate the manufacturing steps in sequential order.

Figure 2:
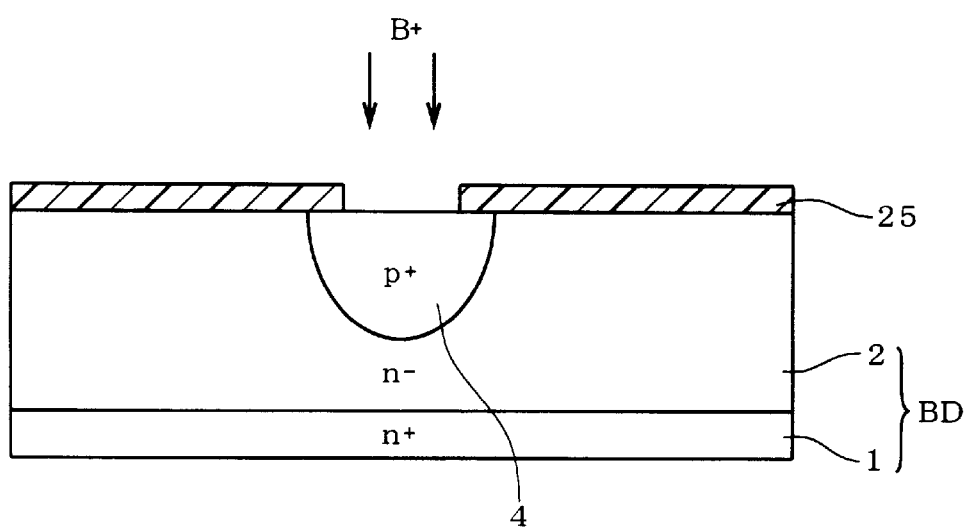
FIGS. 2 through 10 are cross-sectional views showing a method of manufacturing the semiconductor device according to the first preferred embodiment of the present invention.

Initially, the semiconductor substrate 1 containing the n-type impurity of the relatively high concentration is prepared. The epitaxial layer 2 containing the n-type impurity of the relatively low concentration is formed on the semiconductor substrate 1. Referring to FIG. 2, an implantation mask 25 is patterned on the epitaxial layer 2, and a p-type impurity, e.g. boron ions ($B^+$), is implanted into the epitaxial layer 2 through an opening of the implantation mask 25. Heat treatment is performed to diffuse the implanted boron ions to selectively form the deep semiconductor region 4.

The deep semiconductor region 4 is formed for the purposes of reducing a contact resistance with the source electrode 11 to be formed later, preventing breakdown at turn-off, and reducing a resistance element in the first semiconductor region 3 immediately under the second semiconductor regions 5 to be formed later. However, the deep semiconductor region 4 is not an essential constituent for the DMOS transistor 100, and the step of forming the deep semiconductor region 4 may be omitted.

Figure 3:
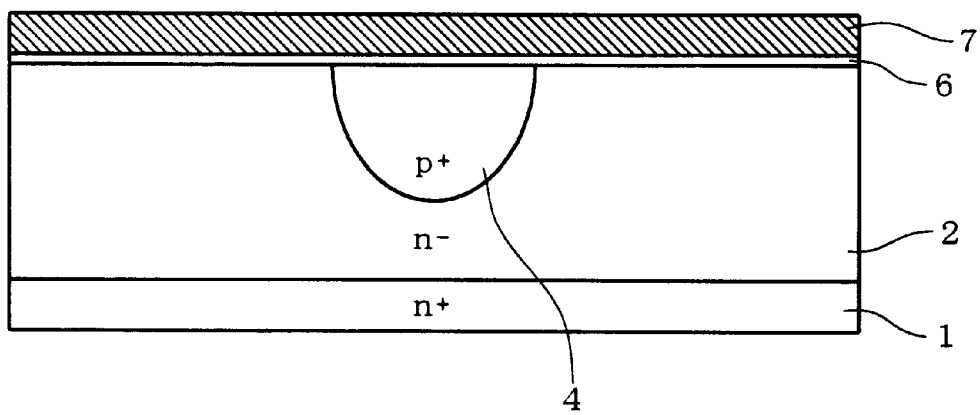

As illustrated in FIG. 3, a TEOS film serving as the gate insulation film 6 is formed on the epitaxial layer 2, for example, by the CVD (Chemical Vapor Deposition) process. Then, a polysilicon film serving as the gate 7 is formed on the gate insulation film 6, for example, by the CVD process.

Figure 4:
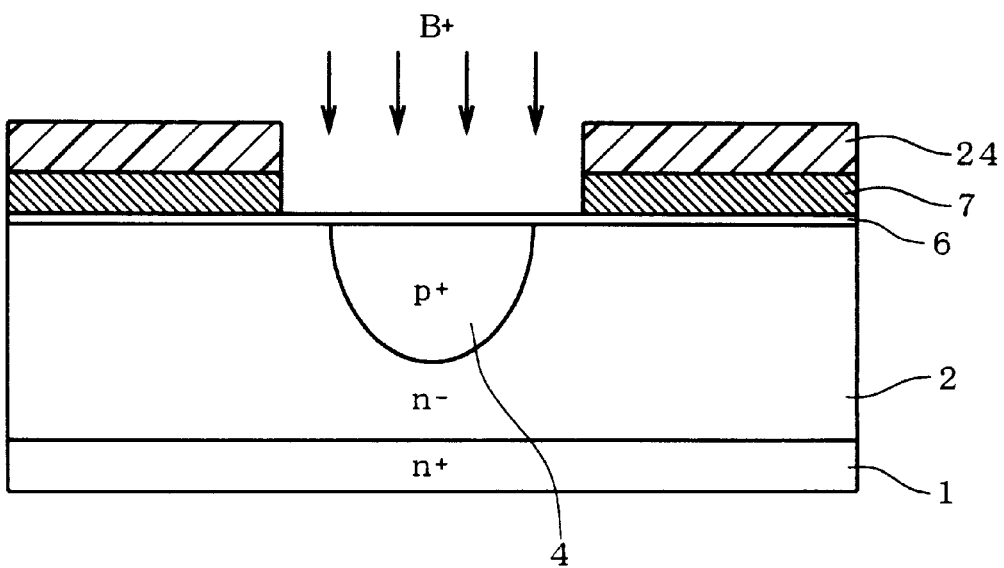

With reference to FIG. 4, an etching mask 24 is patterned on the gate 7, and the gate 7 is etched into a mask pattern. Since the gate 7 is made of polysilicon, the etching performed in this step is anisotropic etching by means of the RIE (Reactive Ion Etching) process.

Thereafter, a p-type impurity, e.g. boron ions ($B^+$), is implanted into the epitaxial layer 2 through an opening of the gate 7 and then through the gate insulation film 6. The implantation conditions for the boron ions are such that the implantation energy is 50 to 150 keV and the ion range, i.e. implantation depth, is 1600 to 4500 Å. The width of the opening of the gate 7 is set at not less than the diffusion range of the first semiconductor region 3.

Figure 5:
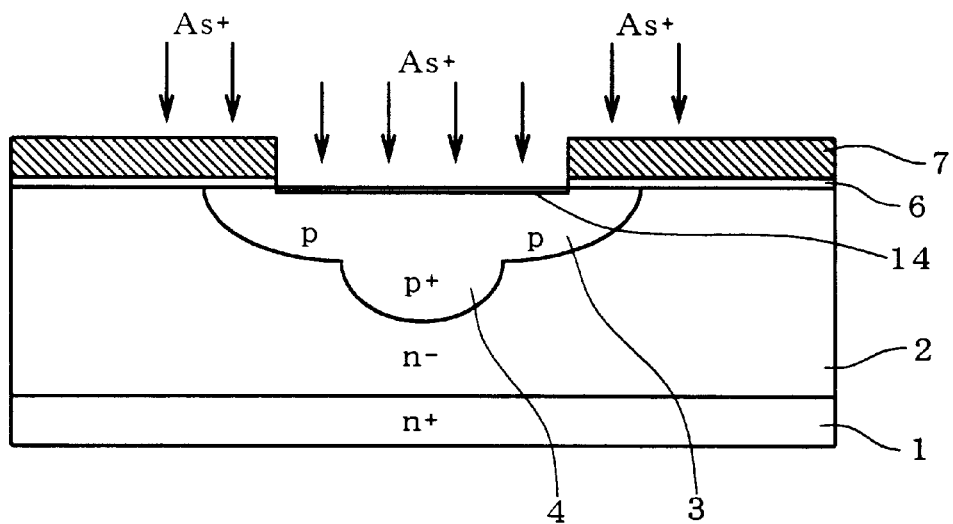

Next, as shown in FIG. 5, heat treatment is performed to diffuse the implanted boron ions, thereby selectively forming the first semiconductor region 3 in partially overlapping relationship with the deep semiconductor region 4.

Thereafter, using the gate 7 as an etching mask, part of the gate insulation film 6 which is exposed in the opening of the gate 7 is etched away. Then, an n-type impurity, e.g. arsenic ions ($As^+$), is implanted into the epitaxial layer 2 through the opening of the gate 7 to form an ion-implanted region 14. The implantation conditions for the arsenic ions are such that the implantation energy is about 50 keV and the ion range is about 550 Å.

Figure 6:
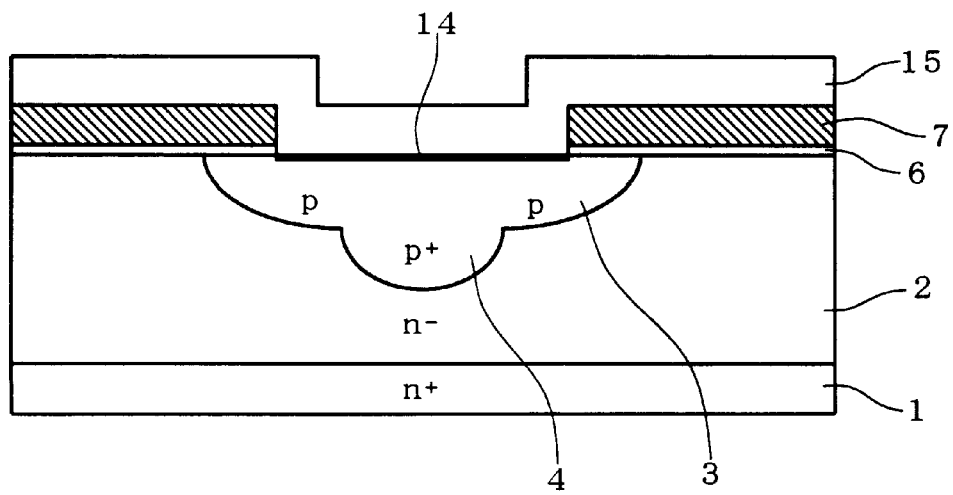

As illustrated in FIG. 6, an oxide film 15 having a thickness of 4000 to 8000 Å are formed by the CVD process to cover the entire top surface of the resultant structure.

Figure 7:
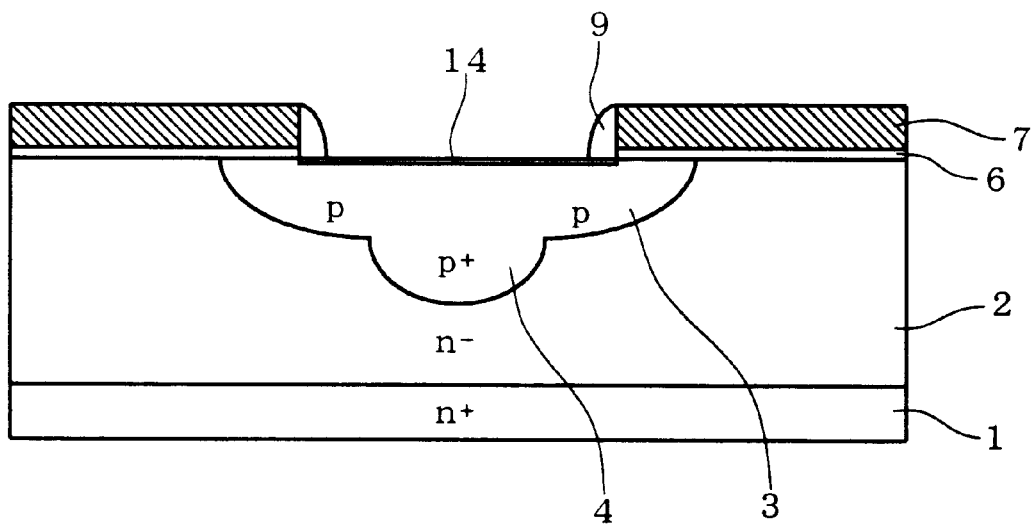

Referring to FIG. 7, anisotropic etching using the RIE process and the like is performed to remove the oxide film 15 from above the gates 7 so that parts of the oxide film 15 which cover the side surfaces of the gates 7 and the gate insulation films 6 and the upper surface of the edges of the ion-implanted region 14 are left to form the sidewall insulation films 9. Thereafter, a p-type impurity, e.g. boron ions, may be implanted to increase the impurity concentration in the surfaces of the first semiconductor region 3 and the deep semiconductor region 4 to reduce the contact resistance with the silicide film 8 to be formed later. In such a case, the implantation conditions for the boron ions are such that the implantation energy is about 50 keV and the ion range is about 1600 Å.

Figure 8:
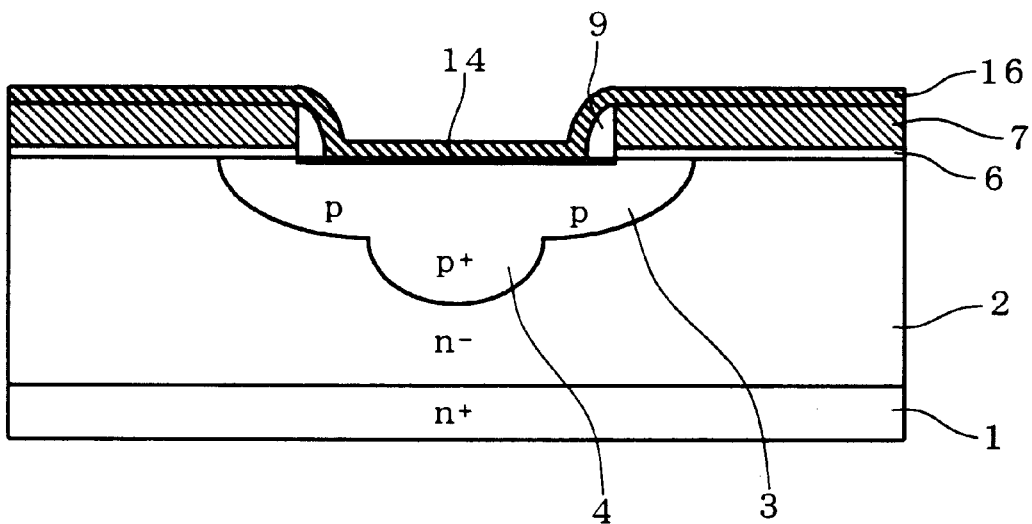

Then, as shown in FIG. 8, a metal film 16 is formed to cover the entire top surface of the resultant structure by sputtering. The metal film 16 is provided to form a silicide film and is made of platinum (Pt), titanium (Ti), aluminum (Al), tungsten (W) or the like. The thickness of the metal film 16 is preferably greater than the thickness (diffusion depth) of the second semiconductor regions 5 to be formed later, but is set at about 1000 Å in consideration for manufacturing costs.

Figure 9:
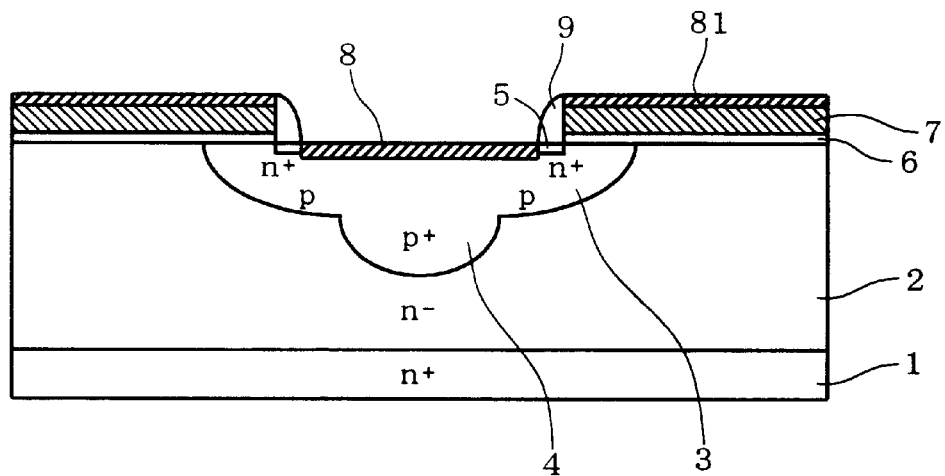

Next, with reference to FIG. 9, parts of the metal film 16 which overlie the first semiconductor region 3, the deep semiconductor region 4 and the gates 7 are silicided by annealing to form the silicide films 8 and 81. Part of the metal film 16 which overlies the sidewall insulation films 9 is not silicided and is hence removed by wet etching and the like. This provides electric isolation between the silicide film 8 and the gates 7.

The siliciding is achieved by annealing at a temperature ranging between 600° C. and 880° C. The annealing time is a maximum of about 30 minutes.

To increase the contact area with the second semiconductor regions 5 to reduce the contact resistance, the silicide film 8 is required to be deeper than the second semiconductor regions 5. Thus, the siliciding is optimized within the range of the above described annealing conditions.

Parts of the ion-implanted region 14 which lie immediately under the sidewall insulation films 9 are silicided into the second semiconductor regions 5 having a depth on the order of 2000 to 3000 Å because of the diffusion of the n-type impurity. In this case, part of the ion-implanted region 14 which lies other than immediately under the sidewall insulation films 9 is modified into the silicide film 8.

The second semiconductor regions 5 may be formed by thermal diffusion in an earlier stage, i.e., after the step of forming the ion-implanted region 14 described with reference to FIG. 5. In such a case, part of the second semiconductor regions 5 which lies other than immediately under the sidewall insulation films 9 is modified into the silicide film 8.

Figure 10:
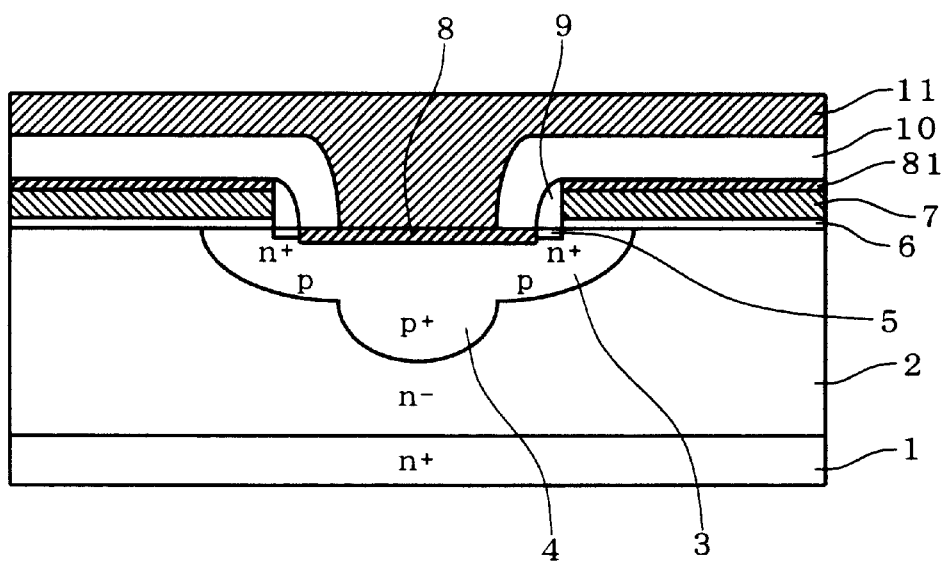

Then, with reference to FIG. 10, the isolating insulation films 10 patterned to have a predetermined opening overlying the silicide film 8 are formed. The opening is filled with a conductive layer in contact with the silicide film 8 to form the source electrode 11.

Finally, the drain electrode 12 is formed on the opposite main surface of the semiconductor substrate 1 from the epitaxial layer 2. This provides the DMOS transistor 100 shown in FIG. 1.

The semiconductor body BD comprising the $n^+$ semiconductor substrate 1 and the $n^-$ epitaxial layer 2 is described hereinabove, but is not limited thereto. For example, the semiconductor body BD may comprise an $n^-$ semiconductor substrate and an $n^+$ semiconductor layer, with a DMOS transistor fabricated into the $n^-$ semiconductor substrate.

The DMOS transistor 100 which is of the p-channel type as above described may be of an n-channel type, in which case the conductivity types of the respective semiconductor layers are, of course, inverted.

<A-3. Characteristic Function and Effect>

Figure 16:
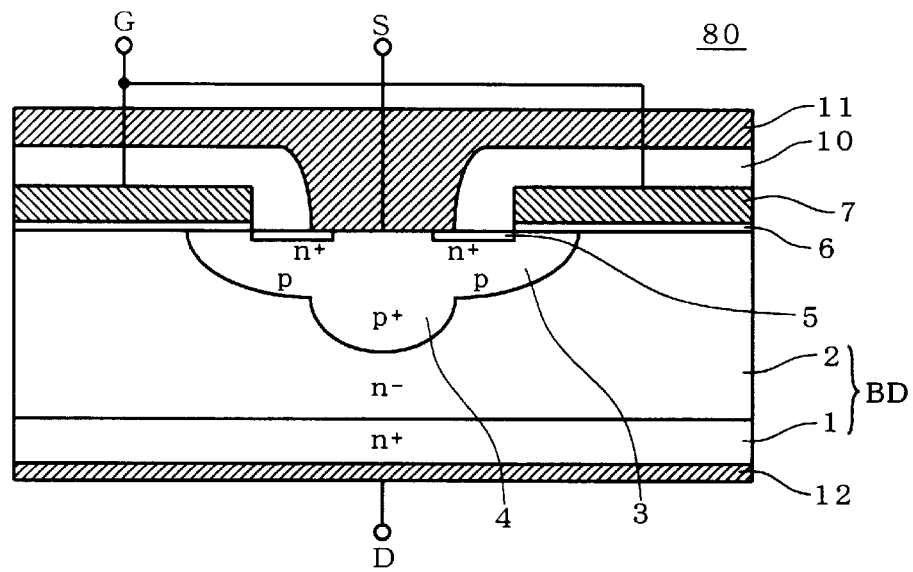
FIG. 16 is a cross-sectional view of a background art semiconductor device.
Figure 17:
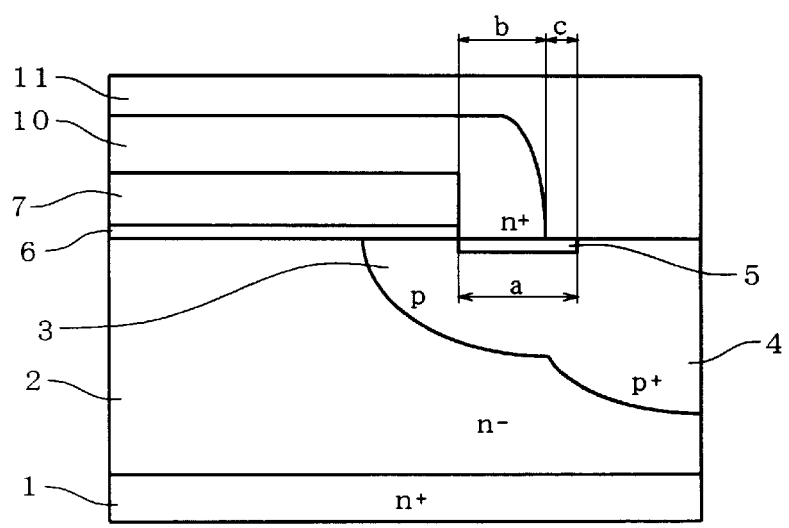
FIG. 17 illustrates problems with the background art semiconductor device.
Figure 18:
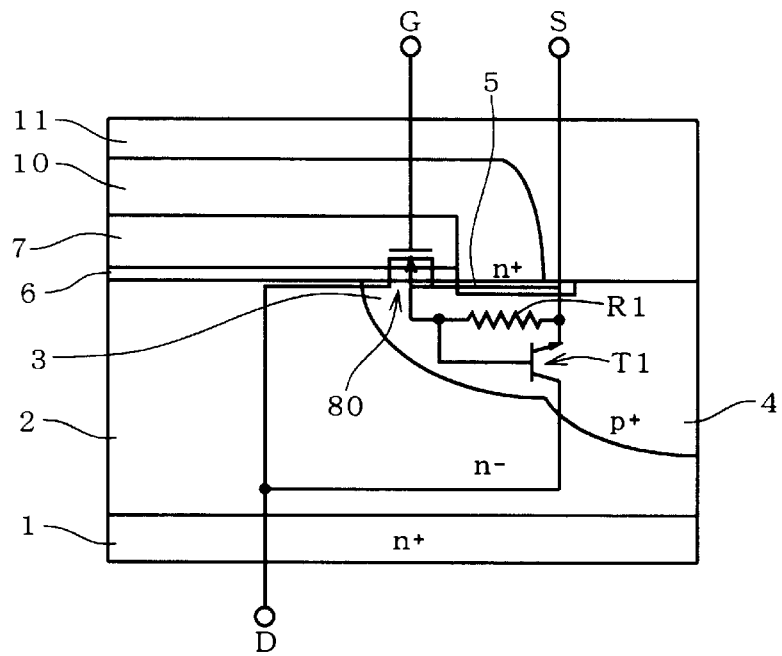
FIG. 18 illustrates an equivalent circuit of the background art semiconductor device.
Figure 19:
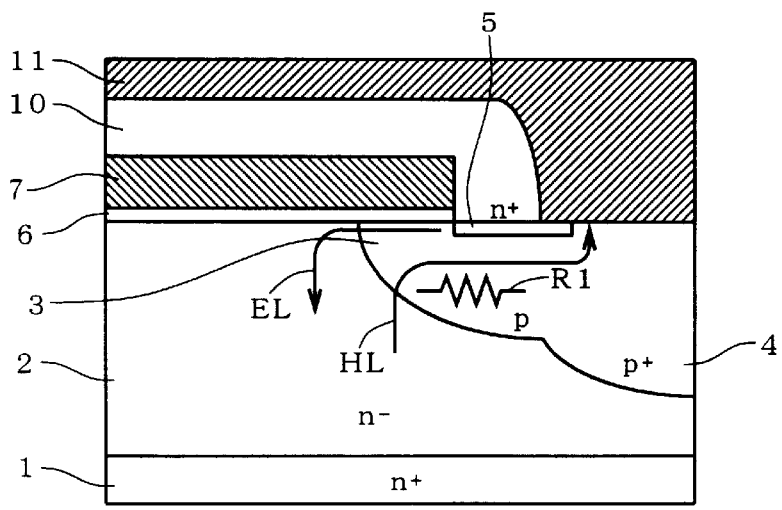
FIG. 19 is a cross-sectional view illustrating a main current flow in the background art semiconductor device.
Figure 20:
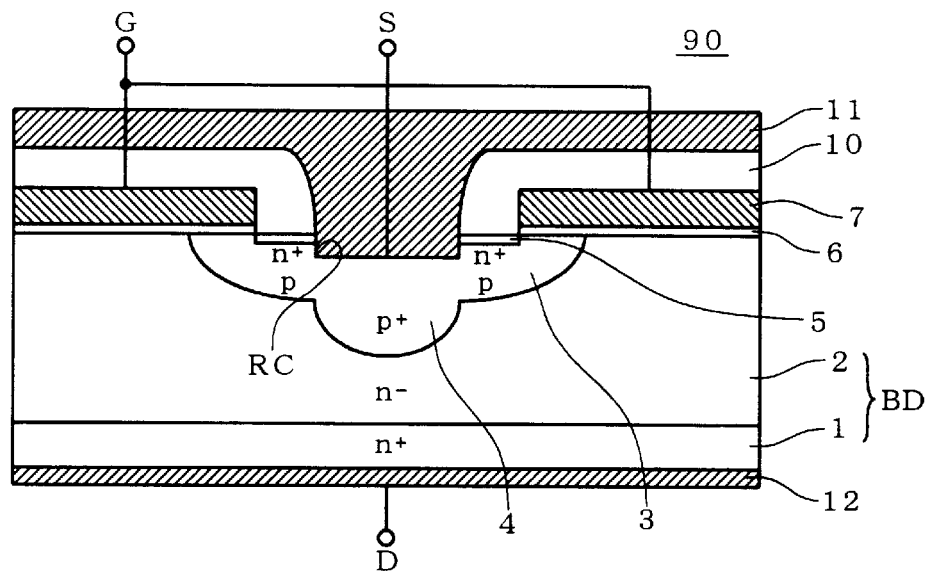
FIG. 20 is a cross-sectional view of another background art semiconductor device.
Figure 21:
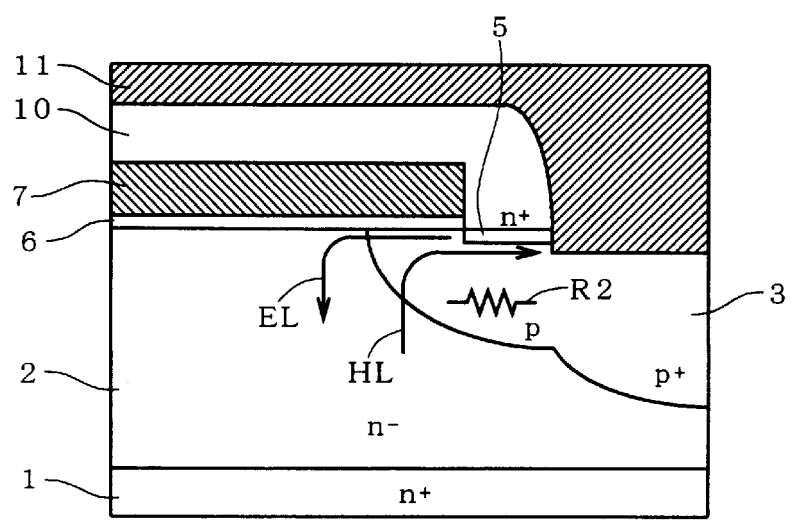
FIG. 21 is a cross-sectional view illustrating a main current flow in the background art semiconductor device of FIG. 20.

In the above-mentioned DMOS transistor 100, the second semiconductor regions 5 are formed immediately under the sidewall insulation films 9, and the length of the second semiconductor regions 5 as measured in the direction of a main current flow is approximately equal to the width of the sidewall insulation films 9, i.e., 4000 to 8000 Å. This allows an extremely low resistance element in the first semiconductor region 3 under the second semiconductor regions 5. More specifically, the resistance element in the DMOS transistor 100 is reduced to about one-half to one-tenth that of the background art DMOS transistors 80 and 90 described with reference to FIGS. 16 and 20. The decrease in the resistance element in the first semiconductor region 3 under the second semiconductor regions 5 makes the electric potential resulting from the resistance element difficult to exceed the built-in potential (about 0.7 V) of a pn junction even if the hole current increases, thereby preventing a parasitic NPN transistor from turning ON. This eliminates the need to limit the drain current to increase the safe operating area.

Figure 11:
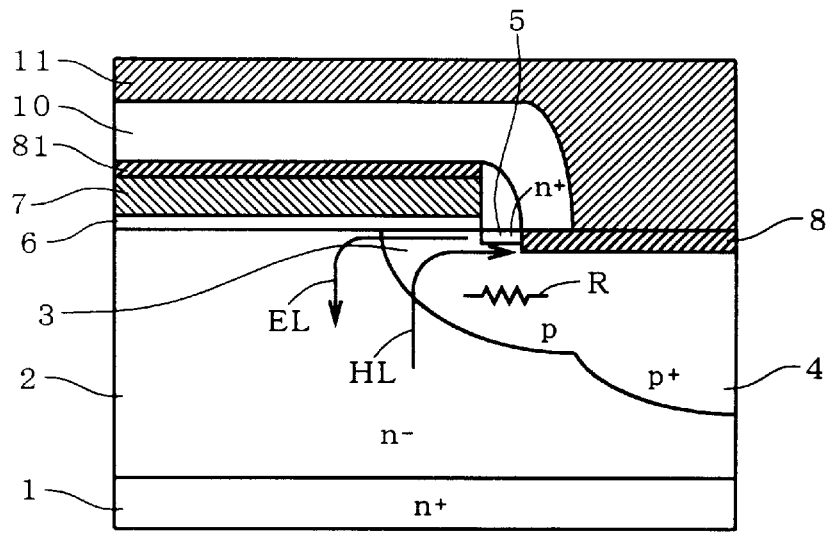
FIG. 11 is a cross-sectional view illustrating a main current flow in the semiconductor device according to the first preferred embodiment of the present invention.

FIG. 11 schematically shows flows of hole current HL and electron current EL and a resistance element R under the second semiconductor region 5 in the DMOS transistor 100.

The sidewall insulation films 9 are formed in a self-aligned manner, and the second semiconductor regions 5 are formed immediately under the sidewall insulation films 9 also in a self-aligned manner. Thus, a high-precision mask alignment step is not required to form both of the sidewall insulation films 9 and the second semiconductor regions 5, and high-precision manufacturing equipment is not required. Therefore, the increase in manufacturing costs is suppressed.

Additionally, there is no need to decrease the thickness of the isolating insulation films 10 which serve as the isolation margin between the gates 7 and the source electrode 11. Therefore, the increase in the rate of faults resulting from a short circuit between the gates 7 and the source electrode 11 is not encountered.

<B. Second Preferred Embodiment>

<B-1. Device Structure>

Figure 12:
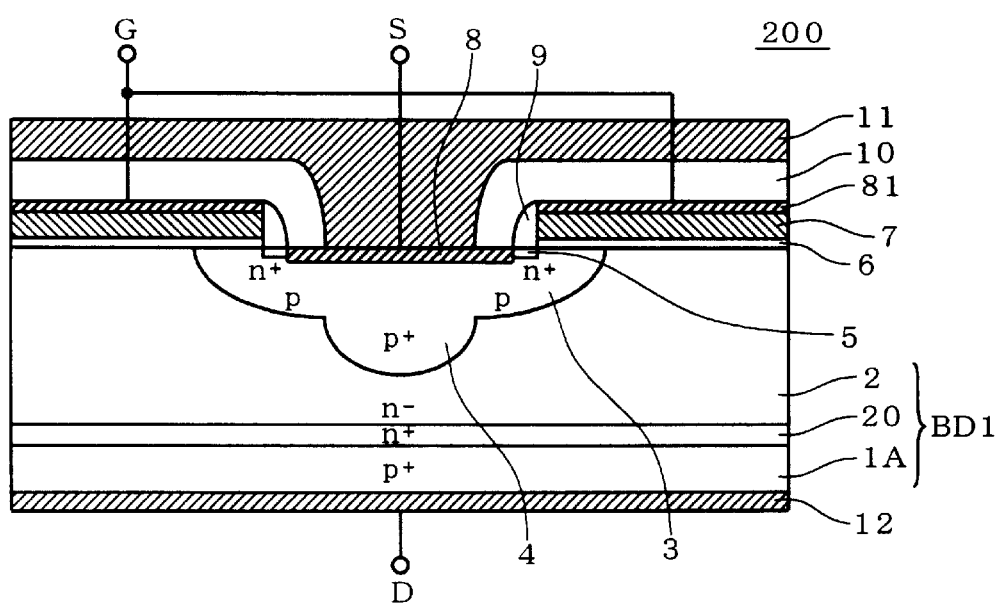
FIG. 12 is a cross-sectional view of the semiconductor device according to a second preferred embodiment of the present invention.

FIG. 12 shows a cross-sectional structure of an IGBT (Insulated Gate Bipolar Transistor) 200 which is the semiconductor device according to a second preferred embodiment of the present invention. An IGBT has a structure that is a combination of a DMOS transistor and a bipolar transistor. Therefore, the IGBT may be constructed such that a DMOS transistor portion thereof is similar to the DMOS transistor 100 described with reference to FIG. 1, to provide an extremely low resistance element in the first semiconductor region 3 under the second semiconductor regions 5.

The IGBT 200 shown in FIG. 12 comprises a semiconductor body BD1 including a semiconductor substrate 1A (third semiconductor layer) such as a silicon substrate which contains a p-type impurity of a relatively high concentration ($1 \times 10^{18}/cm^3$ or higher), an epitaxial layer 20 (second semiconductor layer) formed on the semiconductor substrate 1A and containing an n-type impurity of a relatively high concentration ($1 \times 10^{16}/cm^3$ or higher), and an epitaxial layer 2 (first semiconductor layer) formed on the epitaxial layer 20 and containing an n-type impurity of a relatively low concentration. The remaining structure of the IGBT 200 is similar to that of the DMOS transistor 100 described with reference to FIG. 1. Thus, like reference characters are used to designate constituents identical with those of the DMOS transistor 100 shown in FIG. 1, and the description thereon will be omitted.

Figure 13:
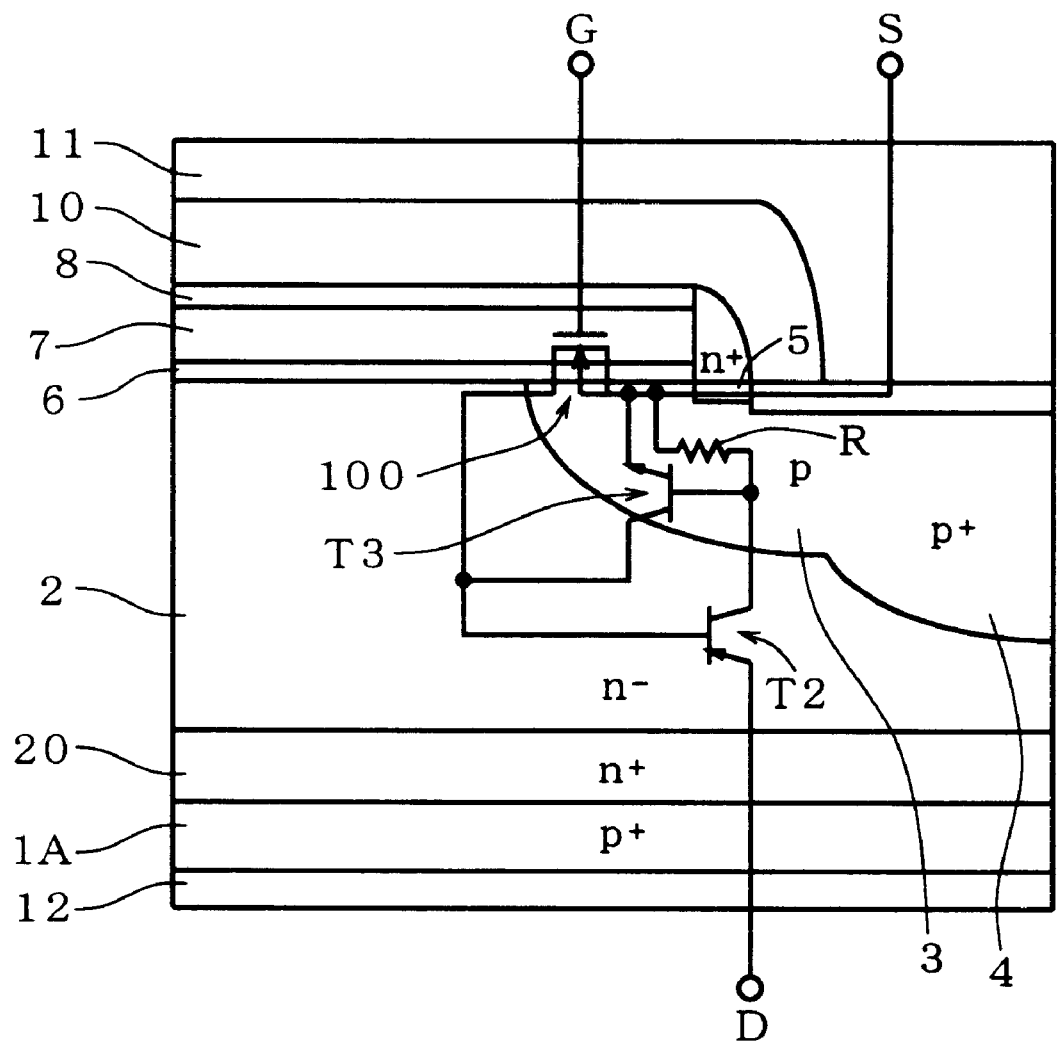
FIG. 13 illustrates an equivalent circuit of the semiconductor device according to the second preferred embodiment of the present invention.

FIG. 13 shows an equivalent circuit of the IGBT 200. As shown in FIG. 13, the IGBT 200 comprises the DMOS transistor 100 including the epitaxial layer 2, the first semiconductor region 3, the second semiconductor region 5 and the gate 7. The IGBT 200 further has a PNP transistor T2 including the semiconductor substrate 1A, the epitaxial layers 20 and 2 and the first semiconductor region 3; a parasitic NPN transistor T3 including the epitaxial layer 2, the first semiconductor region 3 and the second semiconductor region 5; and a resistance element R depending on the length of the second semiconductor region 5 (as measured in the direction of the main current flow) and present in the first semiconductor region 3 under the second semiconductor region 5 which serves as a hole current path.

The semiconductor body BD1 comprising the $p^+$ semiconductor substrate 1A, the $n^+$ epitaxial layer 20, and the $n^-$ epitaxial layer 2 is described hereinabove, but is not limited thereto. For example, the semiconductor body BD1 may comprise an $n^-$ semiconductor substrate, an $n^+$ semiconductor layer and a $p^+$ semiconductor layer, with a DMOS transistor fabricated into the $n^-$ semiconductor substrate.

The DMOS transistor 100 which is of the p-channel type as above described may be of an n-channel type, in which case the conductivity types of the respective semiconductor layers are, of course, inverted.

<B-2. Characteristic Function and Effect>

In the above-mentioned IGBT 200, the second semiconductor regions 5 are formed immediately under the sidewall insulation films 9, and the length of the second semiconductor regions 5 as measured in the direction of the main current flow is approximately equal to the width of the sidewall insulation films 9, i.e., 4000 to 8000 Å. This allows an extremely low resistance element in the first semiconductor region 3 under the second semiconductor regions 5. This makes the electric potential resulting from the resistance element difficult to exceed the built-in potential (about 0.7 V) of the pn junction even if the hole current increases, thereby preventing the parasitic NPN transistor T3 from turning ON. This prevents the parasitic NPN transistor T3 in the ON state from interacting with the PNP transistor T2 to perform a thyristor action.

<C. Third Preferred Embodiment>

<C-1. Device Structure>

Figure 14:
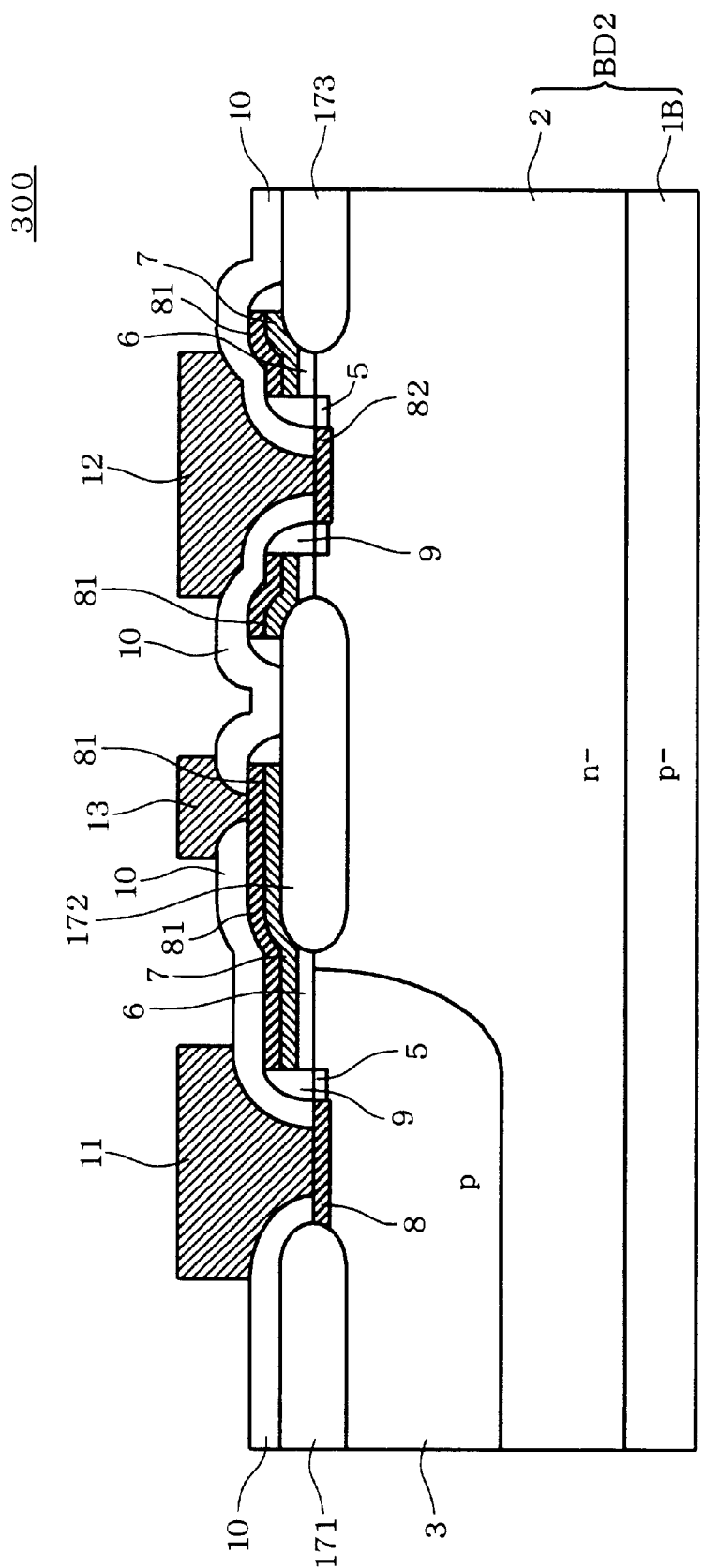
FIG. 14 is a cross-sectional view of the semiconductor device according to a third preferred embodiment of the present invention.

FIG. 14 shows a cross-sectional structure of an LMOS (Lateral MOS) transistor 300 which is the semiconductor device according to a third preferred embodiment of the present invention.

As shown in FIG. 14, the LMOS transistor 300 comprises a semiconductor body BD2 including a semiconductor substrate 1B (second semiconductor layer) such as a silicon substrate which contains a p-type impurity of a relatively low concentration (on the order of $1 \times 10^{15}/cm^3$), and an epitaxial layer 2 (first semiconductor layer) formed on the semiconductor substrate 1B and containing an n-type impurity of a relatively low concentration (on the order of $1 \times 10^{16}/cm^3$).

A first semiconductor region 3 containing a p-type impurity (of a surface concentration on the order of $1 \times 10^{16}/cm^3$) and a left-hand second semiconductor region 5 (as seen in FIG. 14) containing an n-type impurity of a relatively high concentration (a surface concentration on the order of $1 \times 10^{20}/cm^3$) are double diffused in an upper main surface of the epitaxial layer 2. LOCOS (Local Oxide of Silicon) films 171, 172, 173 are formed at the upper main surface of the epitaxial layer 2 in such a manner as to bulge both upwardly and downwardly relative to the upper main surface.

The LOCOS film 171 is formed at an upper surface of the first semiconductor region 3. The LOCOS film 172 is formed in laterally predetermined spaced apart relation to the LOCOS film 171. The LOCOS film 173 is formed in laterally predetermined spaced apart relation to the LOCOS film 172.

A silicide film 8 is formed in the upper main surface of the first semiconductor region 3 so as to extend laterally between a side surface of the left-hand second semiconductor region 5 (as seen in FIG. 14) at its one edge (referred to as a first edge) closer to the LOCOS film 171 and the illustrated side surface of the LOCOS film 171. The source electrode 11 (first main electrode) is formed on the upper surface of the silicide film 8.

A gate insulation film 6 is formed on the first semiconductor region 3 outside of the opposite edge (referred to as a second edge) of the left-hand second semiconductor region 5 from the first edge and on the upper main surface of the epitaxial layer 2. A gate 7 is formed to cover the gate insulation film 6 and partially cover the LOCOS film 172. A silicide film 81 is formed on the gate 7. Part of the first semiconductor region 3 which lies immediately under the gate 7 serves as a channel region when the device is in operation.

A silicide film 82 (under-main-electrode silicide film) is selectively formed in the upper main surface of the epitaxial layer 2 so as to extend laterally between the LOCOS film 172 and the LOCOS film 173. A pair of right-hand second semiconductor regions 5 are selectively formed in contact with the opposite side surfaces of the silicide film 82. A pair of gate insulation films 6 are formed on the upper main surface of the epitaxial layer 2 outside of the right-hand second semiconductor regions 5. A pair of gates 7 are formed to cover the pair of gate insulation films 6 and partially cover the LOCOS films 172 and 173. A pair of silicide films 81 are formed on the pair of gates 7, respectively.

The sidewall insulation films 9 are formed to cover the side surfaces of the silicide films 81, the gates 7 and the gate insulation films 6 and to cover the upper surface of the second semiconductor regions 5. Isolating insulation films 10 are formed to cover the upper surface of the silicide films 81, the sidewall insulation films 9, and upper surface parts of the silicide films 8 and 82. The isolating insulation films 10 are provided for electric isolation between the gates 7 and the source electrode 11.

Over the LOCOS film 172, a gate electrode 13 extends through the isolating insulation films 10 for electric connection to the silicide film 81. A drain electrode 12 (second main electrode) is electrically connected to the silicide film 82 lying between the LOCOS films 172 and 173.

Figure 15:
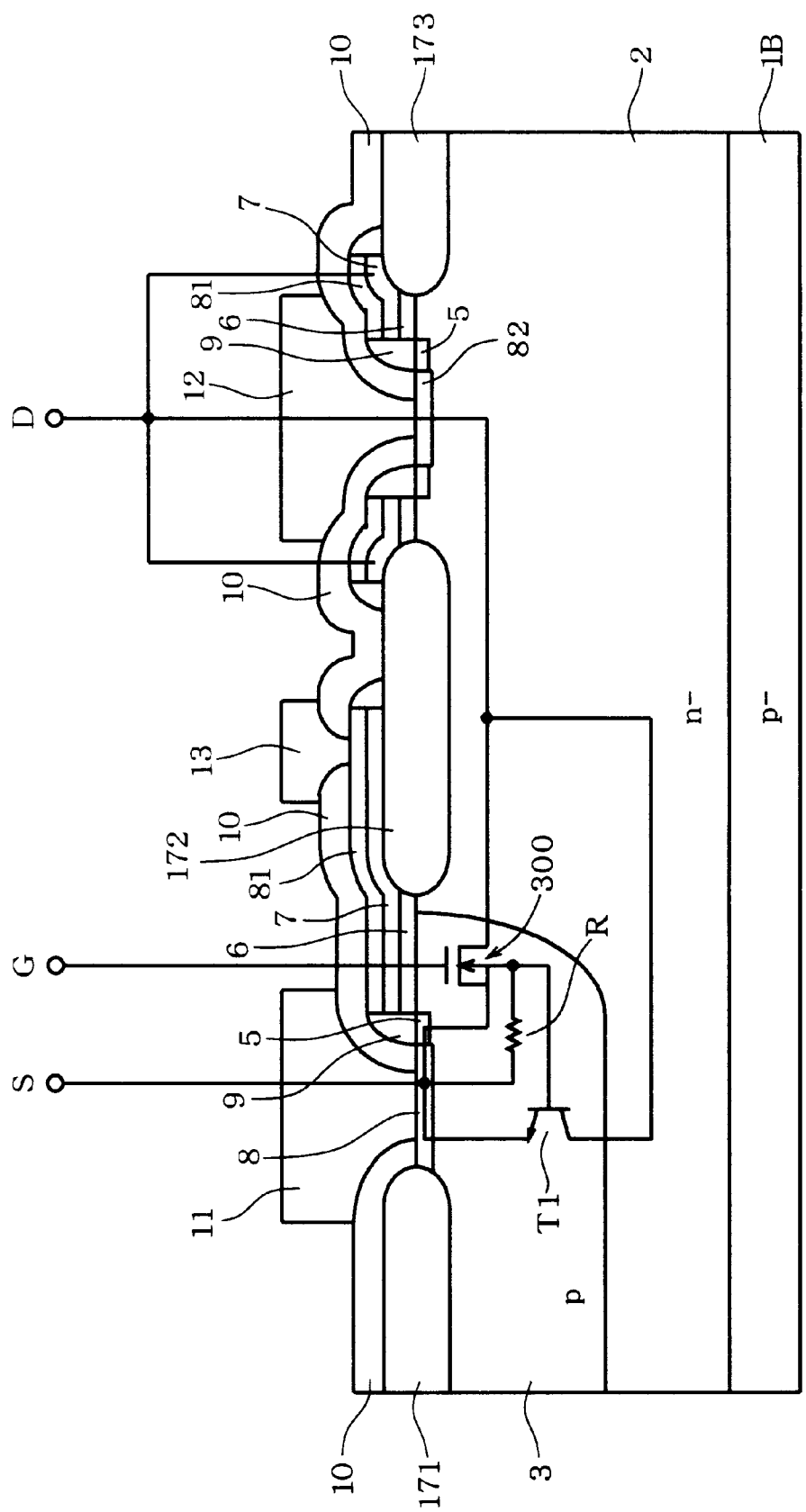
FIG. 15 illustrates an equivalent circuit of the semiconductor device according to the third preferred embodiment of the present invention.

FIG. 15 shows an equivalent circuit of the LMOS transistor 300. As shown in FIG. 15, the LMOS transistor 300 comprises the epitaxial layer 2, the first semiconductor region 3, the left-hand second semiconductor region 5, and the left-hand gate 7. The LMOS transistor 300 further has a parasitic NPN transistor T1 including the epitaxial layer 2, the first semiconductor region 3 and the left-hand second semiconductor region 5, and a resistance element R depending on the length of the left-hand second semiconductor region 5 (as measured in the direction of the main current flow) and present in the first semiconductor region 3 under the left-hand second semiconductor region 5 which serves as a hole current path.

The pair of gates 7 formed on the LOCOS films 172 and 173 do not function as gates but are electrically connected to the drain electrode 12. In FIG. 15, electric connections between the source electrode 11, the drain electrode 12 and the gate electrode 13 are shown in diagrammatic form, and respective terminals thereof are designated by the reference characters S, D and G.

The LMOS transistor 300 shown in FIG. 14 in which the epitaxial layer 2 containing the n-type impurity of the relatively low concentration is formed on the semiconductor substrate 1B containing the p-type impurity of the relatively low concentration may be regarded as a RESURF (REduced SURface Field)-structure LMOS transistor. Also, the LMOS transistor 300 in which the effective channel length thereof is specified by the difference in diffusion length between the first semiconductor region 3 and the left-hand second semiconductor region 5 may be regarded as an LDMOS transistor.

The semiconductor body BD2 comprising the p⁻ semiconductor substrate 1B and the n⁻ epitaxial layer 2 is described hereinabove, but is not limited thereto. For example, the semiconductor body BD2 may comprise an n⁻ semiconductor substrate and a p⁻ semiconductor layer, with a LMOS transistor fabricated into the n⁻ semiconductor substrate.

The LMOS transistor 300 which is of the p-channel type as above described may be of an n-channel type, in which case the conductivity types of the respective semiconductor layers are, of course, inverted.

<C-2. Characteristic Function and Effect>

In the above-mentioned LMOS transistor 300, the left-hand second semiconductor region 5 is formed immediately under the sidewall insulation film 9, and the length of the left-hand second semiconductor region 5 as measured in the direction of the main current flow is approximately equal to the width of the overlying sidewall insulation film 9. This allows an extremely low resistance element in the first semiconductor region 3 under the left-hand second semiconductor region 5. This makes the electric potential resulting from the resistance element difficult to exceed the built-in potential (about 0.7 V) of the pn junction even if the hole current increases, thereby preventing the parasitic NPN transistor from turning ON. This eliminates the need to limit the drain current to increase the safe operating area.

While the invention has been described in detail, the foregoing description is in all aspects illustrative and not restrictive. It is understood that numerous other modifications and variations can be devised without departing from the scope of the invention.

I claim:

1. A semiconductor device comprising:

a first semiconductor layer of a first conductivity type;

a first semiconductor region of a second conductivity type selectively formed in a first main surface of said first semiconductor layer;

a second semiconductor region of the first conductivity type selectively formed in a surface of said first semiconductor region;

a silicide film selectively formed in the surface of said first semiconductor region and in contact with a side surface of said second semiconductor region at its first edge;

a gate insulation film formed on said first semiconductor region outside of a side surface of said second semiconductor region at its second edge opposite from said first edge;

a gate formed on said gate insulation film; and a sidewall insulation film covering a side surface of said gate, a side surface of said gate insulation film, and an upper surface of said second semiconductor region.

2. The semiconductor device according to claim 1, wherein said silicide film is deeper than said second semiconductor region.

3. The semiconductor device according to claim 1, further comprising:

an isolating insulation film formed to cover said gate and said sidewall insulation film and to partially cover said silicide film;

a first main electrode layer electrically connected to part of said silicide film which is not covered with said isolating insulation film;

a second semiconductor layer of the first conductivity type formed on a second main surface of said first semiconductor layer; and a second main electrode layer formed on a main surface of said second semiconductor layer.

4. The semiconductor device according to claim 3, wherein said silicide film is deeper than said second semiconductor region.

5. The semiconductor device according to claim 1, further comprising:

an isolating insulation film formed to cover said gate and said sidewall insulation film and to partially cover said silicide film;

a first main electrode layer electrically connected to part of said silicide film which is not covered with said isolating insulation film;

a second semiconductor layer of the first conductivity type formed on a second main surface of said first semiconductor layer;

a third semiconductor layer of the second conductivity type formed on a main surface of said second semiconductor layer; and a second main electrode layer formed on a main surface of said third semiconductor layer.

6. The semiconductor device according to claim 5, wherein said silicide film is deeper than said second semiconductor region.

7. The semiconductor device according to claim 1, further comprising:

an isolating insulation film formed to cover said gate and said sidewall insulation film and to partially cover said silicide film;

a first main electrode layer electrically connected to part of said silicide film which is not covered with said isolating insulation film;

an under-main-electrode silicide film selectively formed in said first main surface of said first semiconductor layer and in spaced apart relationship with said first semiconductor region; and a second main electrode layer formed on said under-main-electrode silicide film.

8. The semiconductor device according to claim 7, wherein said silicide film is deeper than said second semiconductor region.

* * * * *